United States Patent
Hsieh et al.

(10) Patent No.: US 6,790,758 B2
(45) Date of Patent: Sep. 14, 2004

(54) METHOD FOR FABRICATING CONDUCTIVE BUMPS AND SUBSTRATE WITH METAL BUMPS FOR FLIP CHIP PACKAGING

(75) Inventors: Han-Kun Hsieh, Miaoli (TW); Wei-Feng Lin, Hsinchu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/302,940

(22) Filed: Nov. 25, 2002

(65) Prior Publication Data

US 2004/0102028 A1 May 27, 2004

(51) Int. Cl.⁷ .............................................. H01L 21/44
(52) U.S. Cl. ..................... 438/612; 438/25; 438/26; 438/51; 438/55; 438/64; 438/106; 438/108; 438/112; 438/687; 257/678
(58) Field of Search ..................... 438/612, 25–26, 438/51–55, 64, 106–112, 687; 257/678

(56) References Cited

U.S. PATENT DOCUMENTS

| | | | | |
|---|---|---|---|---|
| 4,992,847 A | * | 2/1991 | Tuckerman | 257/623 |
| 5,767,010 A | * | 6/1998 | Mis et al. | 438/614 |
| 6,031,293 A | * | 2/2000 | Hsuan et al. | 257/786 |
| 6,074,893 A | * | 6/2000 | Nakata et al. | 438/106 |
| 6,175,161 B1 | * | 1/2001 | Goetz et al. | 257/780 |
| 6,277,669 B1 | * | 8/2001 | Kung et al. | 438/106 |
| 6,306,682 B1 | * | 10/2001 | Huang et al. | 438/107 |
| 6,638,847 B1 | * | 10/2003 | Cheung et al. | 438/612 |
| 2002/0074667 A1 | * | 6/2002 | Chinda et al. | 257/774 |
| 2002/0079575 A1 | * | 6/2002 | Hozoji et al. | 257/734 |
| 2003/0209806 A1 | * | 11/2003 | Akagawa | 257/758 |
| 2003/0222352 A1 | * | 12/2003 | Kung et al. | 257/772 |

FOREIGN PATENT DOCUMENTS

EP    1-148-548-A26    *  3/2001    ......... H01L/23/485

* cited by examiner

Primary Examiner—Matthew Smith
Assistant Examiner—Granvill D. Lee, Jr.
(74) Attorney, Agent, or Firm—Birch, Stewart, Kolasch & Birch, LLP

(57) ABSTRACT

A process for fabricating a flip-chip substrate with metal bumps thereon. A flip-chip substrate is provided with conductive points thereon and a conductive film is formed over the surface of the flip-chip substrate to cover the conductive points. A photoresist layer is formed over the conductive layer and then patterned to form openings exposing the underlying conductive points. A copper plating is performed to fill the openings as copper bumps. The photoresist layer and the conductive film are removed. Finally, a solder mask layer is formed over the flip-chip substrate and exposing the copper bumps and an anti-oxidation treatment is performed to finish exposing the copper bumps.

11 Claims, 5 Drawing Sheets

METHOD FOR FABRICATING CONDUCTIVE BUMPS AND SUBSTRATE WITH METAL BUMPS FOR FLIP CHIP PACKAGING

BACKGROUND OF THE INVENTION

1. Field of the Invention

The present invention relates to a packaging substrate. More specifically, it relates to a method for fabricating metal bumps by electroplating on a flip-chip substrate for flip chip packaging.

2. Description of the Related Art

Ball Grid Array (hereinafter referred to as BGA) packaging is widely applied to package the integrated circuits of chip sets or graphic chips, etc. Conventionally, the BGA packaging has tin balls provided on the bottom surface of a substrate and arranged in a form of an array. The balls serve as the leads or pins (conductive media) between a chip (or IC) and a circuit board, replacing the conventional lead frames. The BGA packaging can provide not only more pins but also more space between every two adjacent pins than that of conventional packaging, under the same size of substrate. In addition, BGA packaging provides superior heat dissipation and electrical conductivity by providing shorter conducting paths between the chip and the circuit board.

According to the raw material of the substrate, BGA substrates are divided into three categories: Plastic BGA (PBGA), Metal BGA (MBGA), and Tape BGA (TBGA). The PBGA substrate is made of organic materials such as compounds of BT resin and glass fiber. It is the most popular BGA substrate in the packaging industry.

To meet the need for shrinking package sizes and growing lead counts, flip chip and ball grid array (BGA) technologies have become increasingly popular. Flip chip relates to the attachment of an integrated circuit to a substrate while BGA relates to the attachment of a substrate to a printed circuit board or the like. Flip chip BGA packages (FCBGA), which combine the two technologies, are relatively small and have relatively high lead counts.

One conventional method for creating FCBGA packages is shown in FIG. 1. Solder pads are formed on an integrated circuit 102 and the integrated circuit 102 is bonded to solder bumps on one side of a substrate 106 to form conductive solder balls 104, and underfill 103 is then dispensed between gaps between the integrated circuit 102 and the substrate 106 and then cured, and solder balls 108 are attached to the other side of the substrate 106 to connect to another printed circuit board.

The substrate for flip chip packaging is usually formed by fabricating bumps on an insulating substrate with wiring thereon. Conventionally, the bump pads are fabricated by solder paste printing to form conductive bumps on the substrate, which is generally called pre-soldering. One disadvantage of the solder printing process is the complex steps. Another advantage is the solder paste printing process can only be performed on tools specified for printed circuit boards. Also, the reliability of bump bonding depends on the material of bump pads, conventionally Sn—Pb alloys or the like formed by solder paste printing.

SUMMARY OF THE INVENTION

To simplify the above process for fabricating bump pads on a substrate for flip chip packaging, an object of the present invention is to provide a process for fabricating metal bumps on a flip-chip substrate by electroplating.

Another object of the present invention is to provide a process for fabricating a flip-chip substrate with copper bumps thereon. The copper bumps will form stable Sn—Cu intermetallic compounds (IMC) with bonding pads on IC chips after packaging and the fabricating process of bumps on a flip-chip substrate is also simplified.

To achieve the above objects, the present invention provides a process for fabricating conductive bumps, comprising the following steps. A substrate is provided with conductive points thereon and a conductive film is formed over the surface of the substrate to cover the conductive points. A photoresist layer is formed over the conductive layer and patterned to form openings exposing the underlying conductive points. An electroplating is performed to fill the openings as metal bumps. Finally, the photoresist layer and the conductive film are removed and a solder mask layer is formed over the substrate and exposing the metal bumps.

The present invention further provides a process for fabricating a flip-chip substrate with copper bumps thereon, comprising the following steps. A flip-chip substrate is provided with conductive points thereon and a conductive film is formed over the surface of the flip-chip substrate to cover the conductive points. A photoresist layer is formed over the conductive layer and then patterned to form openings exposing the underlying conductive points. A copper plating is performed to fill the openings as copper bumps. The photoresist layer and the conductive film are removed. Finally, a solder mask layer is formed over the flip-chip substrate, exposing the copper bumps, and an anti-oxidation treatment is performed to finish the exposed copper bumps.

According to the present invention, the electroplating process can deposit conductive metal bumps in predetermined openings, which provides a simpler and easier process to take the place of conventional solder paste printing process. Also, a more stable bonding will be achieved between copper bumps on a flip-chip substrate formed according to the invention and bonding pads on a chip by forming the Sn—Cu intermetallic compounds (IMC) after packaging.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

FIGS. 2A to 2G are cross sections illustrating a process flow of fabricating conductive metal bumps on a flip-chip substrate according to one embodiment of the present invention.

Figure 1:
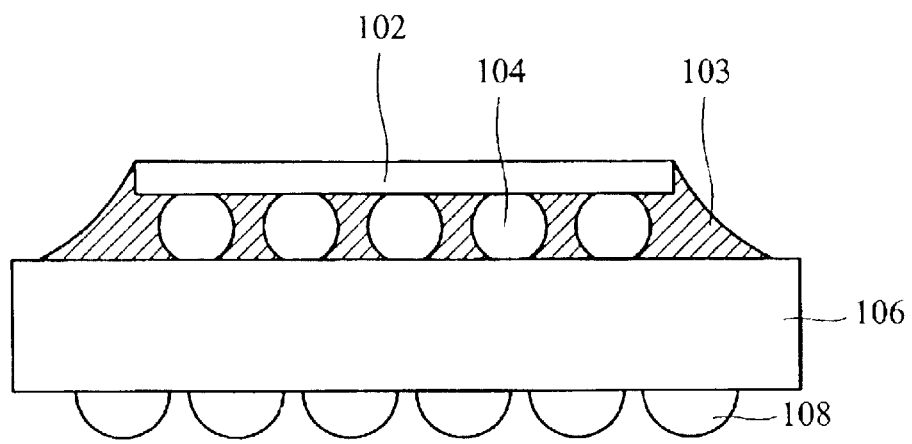
FIG. 1 is a schematic drawing illustrating the cross section of a conventional flip chip ball grid array packaging (FCBGA).
Figure 2A:
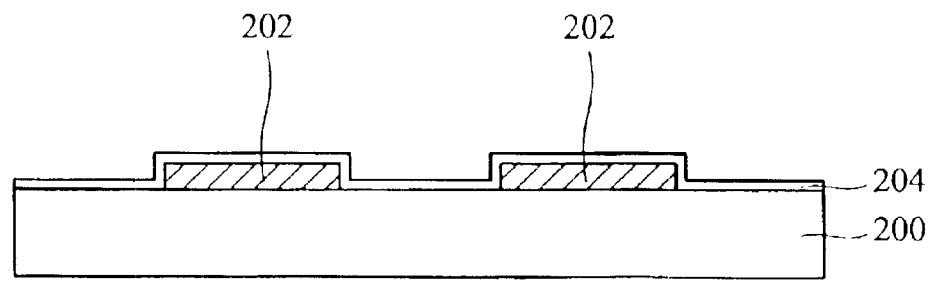
FIGS. 2A to 2G are cross sections illustrating a process flow of fabricating conductive metal bumps on a flip-chip substrate according to one embodiment of the present invention.

In FIG. 2A, conductive points are formed on a substrate 200 for flip chip packaging to connect predetermined conductive wiring therein (not shown). The preferred conductive points are copper pads 202. A conductive film 204 is then formed over the surface of the flip-chip substrate 200 covering the conductive points 202. The conductive film 204 is preferably formed by plating a layer of copper on the surface of the flip-chip substrate 200 as a conductive film. More preferably, the copper layer 204 is formed by electroless plating that immerses the substrate 200 in a plating solution with sufficient copper ions, thus a copper film is grown on the surface of the substrate 200 without connecting plating electrodes. The advantages of the electroless electroplating are the good continuity and step coverage, and therefore an even and uniform copper film 204 covering the substrate 200 and the conductive points 204 can be obtained. However, the conductive film is not limited thereby.

Figure 2B:
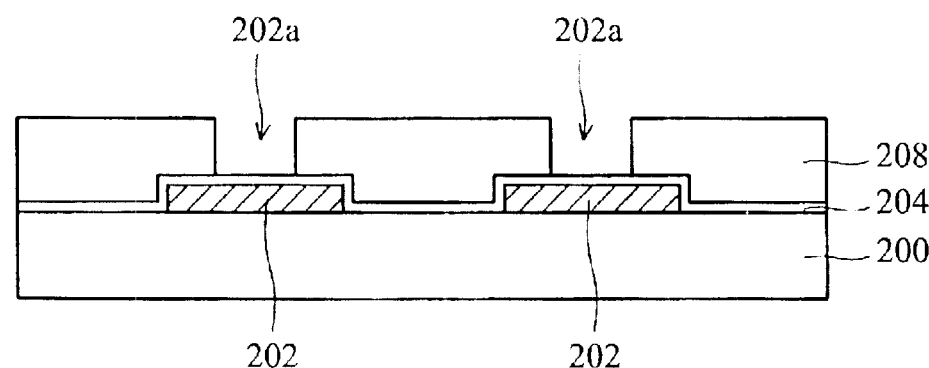

In FIG. 2B, a photoresist layer 208 is formed over the surface of the substrate 200. A photolithography process is then performed to pattern the photoresist layer 208 and form openings 202a exposing the underlying copper pads 202 via the conductive film 204.

Figure 2C:
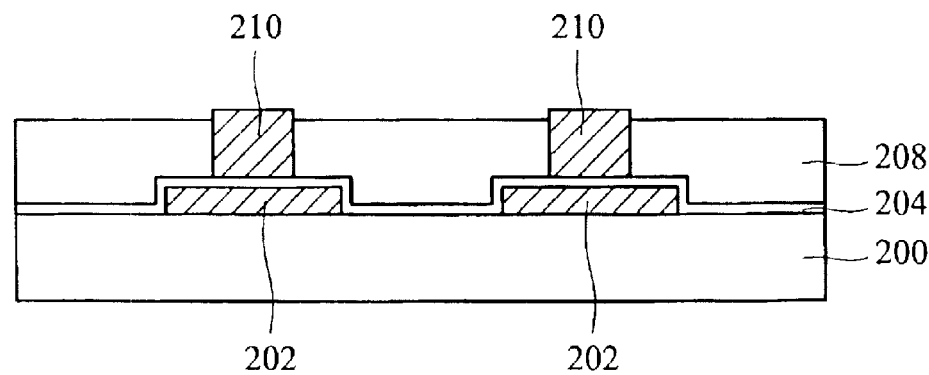

In FIG. 2C, a metal column plating is performed with the copper film 204 as a seed layer to fill the openings 202a. Preferably, copper bumps 210 are formed by copper electroplating on the copper pads 202. The preferred height of the copper bumps 210 can be approximately equal to, or slightly higher than, the thickness of the photoresist layer 208 as shown in FIG. 2C.

One advantage of electroplating is superior filling capacity, and therefore good quality of copper bumps can be achieved by evenly filling the openings 202a with copper metal from the bottom. Other advantages of electroplating are low cost, simple equipment requirement and fast deposition speed, which enables it to take the place of conventional solder paste printing process for flip-chip bumps. Since electroplating is a common process in the printing circuit board industry, there is no need of additional equipment for the electroplating process.

Figure 2D:
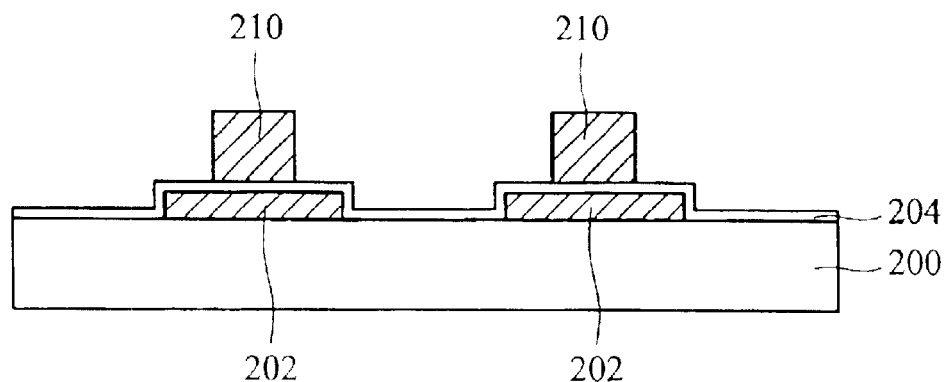

The photoresist layer 208 is removed after the metal bumps 210 are formed, as shown in FIG. 2D.

Figure 2E:
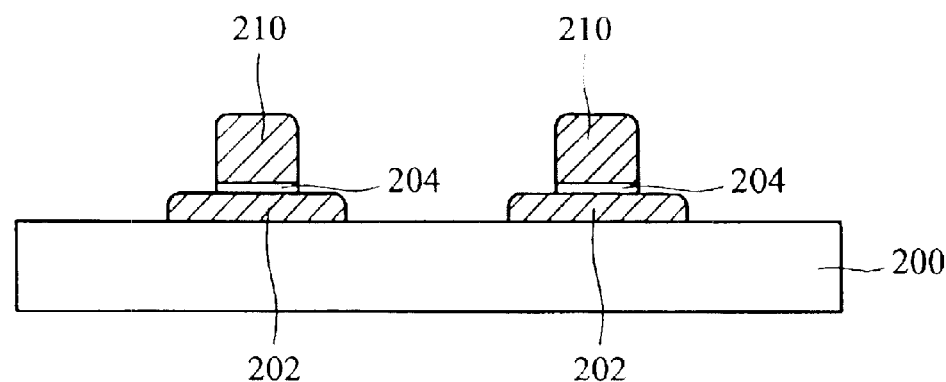

In FIG. 2E, a conventional acid cleaning is performed to remove the residue of the photoresist layer 208. Meanwhile, the exposed the conductive film 204 is also removed by the acidic solution and the copper bumps 210 are micro-etched to form rounded corners that are better for subsequent bonding.

Figure 2F:
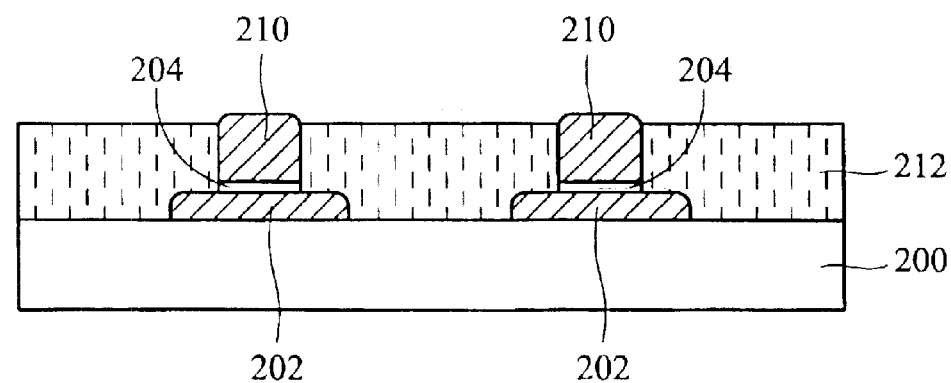

In FIG. 2F, a solder mask layer 212 is formed over the flip-chip substrate 200 and expose the conductive bumps 210. Preferably, the solder mask layer 212 is formed by a conventional solder mask process for printed circuit boards. A polymer layer, e.g. heat-baked epoxy resin or light sensitive Acrylates, is covered over the surface of the substrate 200 exposing the tops of the conductive bumps 210. The polymer layer is a mask layer 212 to protect the substrate 200 from outside damage and short circuit from solder overflow in subsequent process.

Figure 2G:
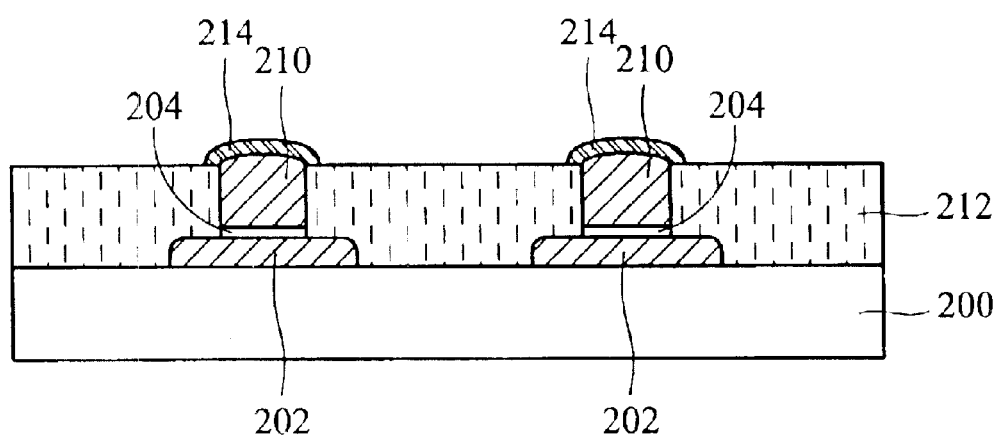

In FIG. 2G, an anti-oxidation finishing treatment is performed on the exposed copper bumps 210. To protect the exposed tops of the copper bumps 210 from oxidation, a conventional hot air solder leveling process (HASL) can be performed to form coating layers 214 thereon. The HASL process is a conventional process to protect copper wiring from oxidation. The substrate 200 can be immersed in melted solder to coat a layer of solder, and extra solder is then blown away by high speed hot air to form anti-oxidation solder coatings 214 on the exposed tops of the conductive bumps 210. The anti-oxidation coating 214 can also be formed on the tops of the metal bumps 210 by a conventional OSP process, i.e. chemical immersion.

Consequently, metal bumps, e.g. copper bumps, can be formed on a flip-chip substrate by electroplating according to the process described.

Figure 3:
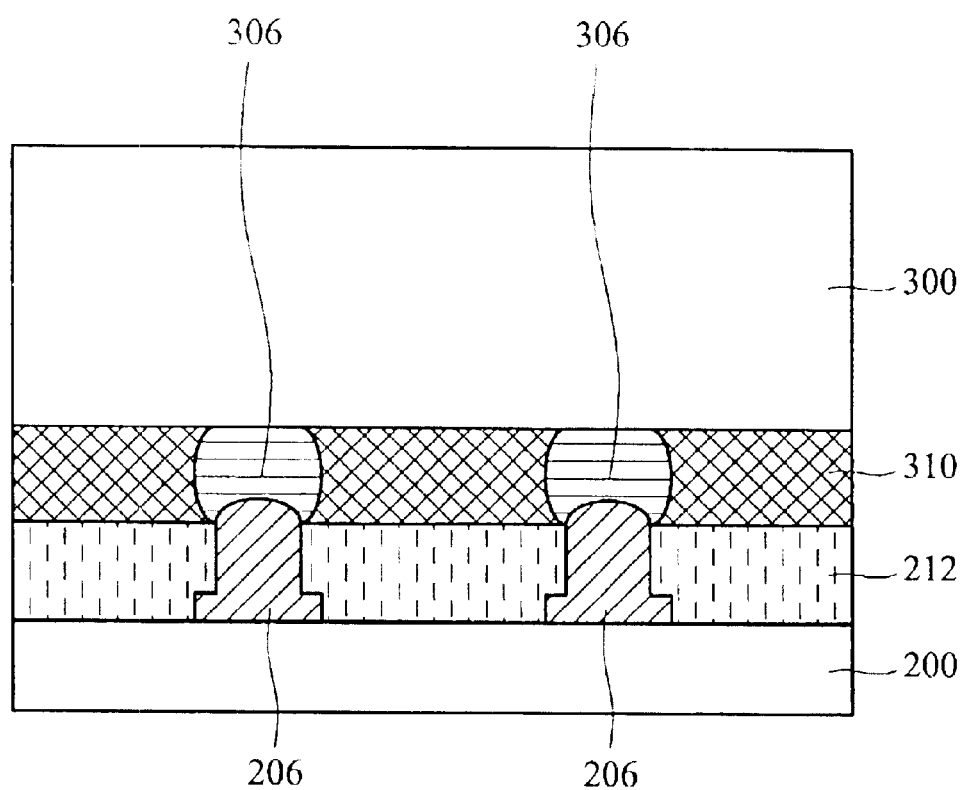
FIG. 3 is a cross section illustrating a flip-chip substrate with copper bumps bonding with a chip according to one embodiment of the present invention.

FIG. 3 illustrates a flip-chip substrate with copper bumps formed according to one embodiment of the invention to bond with a chip (in cross section).

In FIG. 3, bonding pads 306 are formed on a chip 300. A flip-chip substrate 200 with metal bumps 206 constructed by copper pads 202, copper films 204 and copper bumps 206 is bonded to the chip 300 by a conventional bonding process. An underfill material 310 then fills the space between the chip 300 and the flip-chip substrate 200 to stabilize the bonding. Because of the characteristics of copper, the bumps 206 will not totally melt into solder pads 306 on the chip 300 as with conventional solder bumps. However, because the bonding areas of the copper bumps 206 are larger than conventional solder bumps, the copper bumps 206 will bond with the solder pads 306 on the chip 300 to form a more stable Sn—Cu intermetallic compound. The quality and stability of the Sn—Cu intermetallic interface is superior to conventional Sn—Pb intermetallic interface.

One advantage of the above process is to form metal bumps on a flip-chip substrate by electroplating, a simpler and more easily controlled process than conventional bump printing.

Another advantage of the above process is the copper bumps formed by electroplating provide larger bonding areas that can form more stable Sn—Cu intermetallic interface with bonding pads on the chip.

Still another advantage of the above process is no requirement for extra equipment. The equipment, such as electroplating or photolithography tools, involved in the above process, is common in printed circuit board fabrication. Therefore, the inventive process is achieved easily without extra cost.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a flip-chip substrate with copper bumps thereon, comprising the steps of:

providing a flip-chip substrate with a plurality of conductive points thereon;

forming a conductive film over the surface of the flip-chip substrate to cover the conductive points, wherein the conductive film is formed by electroless electroplating to form a copper film over the surface of the flip-chip substrate;

forming a photoresist layer over the conductive layer;

patterning the photoresist layer to form a plurality of openings exposing the underlying conductive points;

performing a copper electroplating to fill the openings as a plurality of copper bumps;

removing the photoresist layer and the conductive film, wherein the conductive film is removed by acid cleaning;

forming a solder mask layer over the flip-chip substrate and exposing the plurality of copper bumps; and performing an anti-oxidation finishing treatment of exposing the copper bumps.

2. The process as claimed in claim 1, wherein the plurality of conductive points are conductive copper pads.

3. The process as claimed in claim 1, further comprising a step of micro-etching the copper bumps to form rounded corners while acid-cleaning the conductive film.

4. The process as claimed in claim 1, wherein the anti-oxidation finishing treatment performs a hot air solder leveling (HASL) on the exposed copper bumps to form an anti-oxidation coating.

5. A process for fabricating a conductive bump, comprising the steps of:

providing a substrate with a plurality of conductive points on the surface;

forming a conductive film over the surface of the substrate to cover the conductive points;

forming a photoresist layer over the conductive layer;

patterning the photoresist layer to form a plurality of openings exposing the underlying conductive points;

performing an electroplating to fill the openings as a plurality of metal bumps;

removing the photoresist layer and the conductive film;

forming a solder mask layer over the substrate and exposing the plurality of metal bumps; and performing an anti-oxidation finishing treatment on the exposed metal bumps.

6. The process as claimed in claim 5, wherein the anti-oxidation finishing treatment performs a hot air solder leveling (HASL) on the exposed metal bumps to form an anti-oxidation coating.

7. The process as claimed in claim 5, wherein the substrate is a flip-chip substrate.

8. The process as claimed in claim 5, wherein the electroplating is copper electroplating and the metal bumps are copper bumps.

9. The process as claimed in claim 5, wherein the conductive film is formed by electroless electroplating to form a metal film over the surface of the substrate.

10. The process as claimed in claim 9, wherein the conductive film is removed by acid cleaning.

11. The process as claimed in claim 10, further comprising a step of micro-etching the metal bumps to form rounded corners while acid cleaning the conductive film.

* * * * *